(12) United States Patent
Bailey et al.

(10) Patent No.: US 7,506,283 B2
(45) Date of Patent: Mar. 17, 2009

(54) SYSTEM AND METHOD FOR ACCELERATING CIRCUIT MEASUREMENTS

(75) Inventors: George R. Bailey, Gaithersburg, MD (US); Iftikharuddin Kahn, Rockville, MD (US)

(73) Assignee: Spirent Communications of Rockville, Inc., Rockville, MD (US)

( * ) Notice: Subject to any disclaimer, the term of this patent is extended or adjusted under 35 U.S.C. 154(b) by 554 days.

(21) Appl. No.: 11/246,527

(22) Filed: Oct. 11, 2005

(65) Prior Publication Data

US 2008/0103704 A1    May 1, 2008

Related U.S. Application Data

(60) Provisional application No. 60/616,639, filed on Oct. 8, 2004.

(51) Int. Cl.
G06F 17/50 (2006.01)
G01R 27/02 (2006.01)

(52) U.S. Cl. .......................................... 716/4; 702/57

(58) Field of Classification Search ................ 716/4, 716/6; 702/57
See application file for complete search history.

(56) References Cited

U.S. PATENT DOCUMENTS

| | | | |
|---|---|---|---|
| 4,075,558 A | 2/1978 | Harzer | |
| 4,814,695 A | 3/1989 | Troesch | |
| 5,121,337 A | 6/1992 | Brown | |
| 5,256,979 A | 10/1993 | Moorman | |
| 5,614,832 A | 3/1997 | Olsen | |
| 5,666,367 A | 9/1997 | Troyanovsky | |
| 5,736,848 A * | 4/1998 | De Vries et al. | 324/142 |
| 6,393,480 B1 | 5/2002 | Qin et al. | |
| 6,426,971 B1 | 7/2002 | Wu et al. | |
| 7,271,608 B1 * | 9/2007 | Vermeire et al. | 324/763 |
| 2004/0006752 A1 * | 1/2004 | Whetsel | 716/4 |
| 2007/0067129 A1 * | 3/2007 | Mattes et al. | 702/106 |

\* cited by examiner

Primary Examiner—Stacy A Whitmore
Assistant Examiner—Magid Y Dimyan
(74) Attorney, Agent, or Firm—Gilberto M. Villacorta; Foley & Lardner LLP

(57) ABSTRACT

A system for accelerating circuit measurements includes a circuit. A signal is applied to the circuit. A set of measurements is taken of a response of the circuit to the applied signal. The system includes a circuit model. The circuit model is a representation of the circuit. A final value of the response of the circuit is determined utilizing the circuit model in accordance with the set of measurements. A stimulus signal is generated in accordance with the final value for driving the circuit model to the final value. The system includes a stimulus generator in communication with the circuit. The stimulus generator is configured to apply the stimulus signal to the circuit. The stimulus signal is configured to accelerate the response of the circuit to reach the final value.

24 Claims, 10 Drawing Sheets

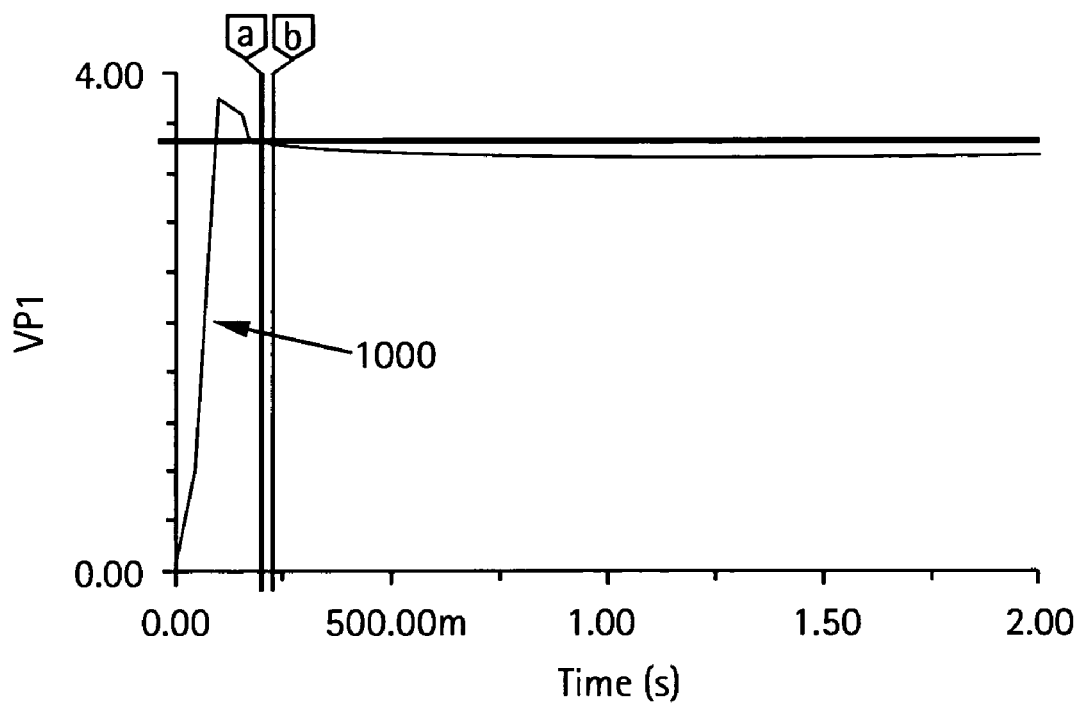

SYSTEM AND METHOD FOR ACCELERATING CIRCUIT MEASUREMENTS

This application claims priority under 35 U.S.C. § 119(e) to U.S. Provisional Application No. 60/616,639, filed on Oct. 8, 2004, the entire contents of which are hereby incorporated by reference herein.

BACKGROUND

1. Field of the Invention

The present invention relates to test equipment for electrical circuits and systems. More particularly, the present invention relates to a system and method for volt-ohm meter measurement acceleration.

2. Background Information

Electrical measurements, such as, for example, DC voltage/current or resistance measurements, can be performed on unknown circuits. Conventionally, the measurement conditions are applied, and then passively wait until the circuit response settles. In other words, there is a waiting time for the response of the unknown circuit to settle before the actual measurement can be performed. The waiting time can take from tens to thousands of milliseconds or longer, depending on such factors as, for example, the particular unknown circuit and the measurement being taken. For instance, one resistance measurement taken by a SPIRENT™ Communications Model No. 3577A COPPERMAX™/RT DSL remote test system can involve dozens of individual voltage measurements under a sequence of conditions, consuming approximately five to approximately ten seconds overall. Multiplying such a delay by the number of measurements necessary to analyze an unknown circuit, and the time consumed can become unacceptably long.

SUMMARY OF THE INVENTION

A system and method are disclosed for accelerating circuit measurements. In accordance with exemplary embodiments of the present invention, according to a first aspect of the present invention, a system for accelerating circuit measurements includes a circuit. A signal is applied to the circuit. A set of measurements is taken of the response of the circuit to the applied signal. The system includes a circuit model. The circuit model comprises a representation of the circuit. A final value of the response of the circuit is determined utilizing the circuit model in accordance with the set of measurements. A stimulus signal is generated in accordance with the final value for driving the circuit model to the final value. The system includes a stimulus generator in communication with the circuit. The stimulus generator is configured to apply the stimulus signal to the circuit. The stimulus signal is configured to accelerate the response of the circuit to reach the final value.

According to the first aspect, the system can include a signal source in communication with the circuit. The signal source can be configured to generate the signal applied to the circuit. The system can include a measurement circuit in communication with the circuit. The measurement circuit can be configured to take measurements of the response of the circuit. The system can include an analyzer in communication with the circuit and the stimulus generator. The analyzer can be configured to determine the final value of the response of the circuit and to determine the stimulus signal utilizing the circuit model.

According to the first aspect, a second set of measurements can be taken of the response of the circuit to the stimulus signal to determine whether the circuit has reached the final value. A second final value of the response of the circuit to the stimulus signal can be determined utilizing the circuit model in accordance with the second set of measurements, when the difference between the response of the circuit to the stimulus signal and the final value is greater than a predetermined value. A second stimulus signal can be generated in accordance with the second final value for driving the circuit model to the second final value. The second stimulus signal can be applied to the circuit to accelerate the response of the circuit to reach the second final value. Additionally or alternatively, the representation of the circuit by the circuit model can be modified to increase the accuracy of the representation, when the difference between the response of the circuit to the stimulus signal and the final value is greater than a predetermined value.

According to the first aspect, the stimulus signal can be applied to the circuit for a predetermined duration of time and/or a predetermined time period. The stimulus signal can comprise, for example, a voltage signal, a current signal, or any suitable stimulus signal. The system can include a filter in communication with the circuit. The filter can be configured to filter the response of the circuit. For example, the filter can comprise a low-pass filter. The circuit measurements can comprise at least one of a measurement of capacitance, a measurement of resistance, a measurement of capacitance and resistance, a measurement of DC voltage, a measurement of AC voltage, a measurement of DC voltage in a presence of AC voltage, a measurement of AC voltage in a presence of DC voltage, a measurement of DC current, a measurement of AC current, a measurement of DC current in a presence of AC current, and a measurement of AC current in a presence of DC current. According to an exemplary embodiment of the first aspect, the set of measurements can include at least two measurements of the response of the circuit.

According to a second aspect of the present invention, a method of accelerating circuit measurements includes the steps of: a.) applying a signal to a circuit; b.) measuring the response of the circuit to the applied signal; c.) determining a final value of the response of the circuit utilizing a representation of the circuit and measurements taken in step (b); d.) generating a stimulus signal in accordance with the final value determined in step (c) for driving the circuit representation to the final value; and e.) applying the stimulus signal to the circuit, wherein the stimulus signal is configured to accelerate the response of the circuit to reach the final value.

According to the second aspect, the method can include the step of: f.) generating the signal applied to the circuit. The method can include the steps of: g.) measuring the response of the circuit to the stimulus signal; and h.) determining whether the circuit has reached the final value. Step (h) can include the step of: i.) determining a difference between the response of the circuit to the stimulus signal and the final value. The method can also include the steps of: j.) determining a second final value of the response of the circuit to the stimulus signal using the circuit representation and measurements taken in step (g), when the difference determined in step (i) is greater than a predetermined value; k.) generating a second stimulus signal in accordance with the second final value determined in step (j) for driving the circuit representation to the second final value; and l.) applying the second stimulus signal to the circuit to accelerate the response of the circuit to reach the second final value. Additionally or alternatively, the method can include the step of: m.) modifying the circuit representation to increase the accuracy of the representation, when the difference determined in step (i) is greater than a predetermined value.

According to the second aspect, the step (e) can include the steps of: n.) applying the stimulus signal to the circuit for a predetermined duration of time; and/or o.) applying the stimulus signal to the circuit during a predetermined time period. The stimulus signal can comprise a voltage signal, a current signal or the like. The method can include the step of: p.) filtering the response of the circuit. Step (p) can include the step of: q.) low-pass filtering the response of the circuit. The circuit measurements can include one or more of a measurement of capacitance, a measurement of resistance, a measurement of capacitance and resistance, a measurement of DC voltage, a measurement of AC voltage, a measurement of DC voltage in a presence of AC voltage, a measurement of AC voltage in a presence of DC voltage, a measurement of DC current, a measurement of AC current, a measurement of DC current in a presence of AC current, and a measurement of AC current in a presence of DC current. According to an exemplary embodiment of the second aspect, at least two measurements can be taken in step (b) of the response of the circuit.

According to a third aspect of the present invention, a system for accelerating circuit measurements includes a circuit. A signal is applied to the circuit. A set of measurements is taken of the response of the circuit to the applied signal. The system includes means for representing the circuit. A final value of the response of the circuit is determined utilizing the circuit representing means in accordance with the set of measurements. A stimulus signal is generated in accordance with the final value for driving the circuit representing means to the final value. The system includes means for applying the stimulus signal to the circuit. The stimulus signal is configured to accelerate the response of the circuit to reach the final value.

According to the third aspect, the system can include means for generating the signal applied to the circuit. The system can include means for taking measurements of the response of the circuit. The system can also include means for determining the final value of the response of the circuit, and means for determining the stimulus signal in accordance with the determined final value of the response of the circuit. A second set of measurements can be taken of the response of the circuit to the stimulus signal to determine whether the circuit has reached the final value. A second final value of the response of the circuit to the stimulus signal can be determined utilizing the circuit representing means in accordance with the second set of measurements, when the difference between the response of the circuit to the stimulus signal and the final value is greater than a predetermined value. A second stimulus signal can be generated in accordance with the second final value for driving the circuit representing means to the second final value. The second stimulus signal can be applied to the circuit to accelerate the response of the circuit to reach the second final value. Alternatively or additionally, the circuit representing means can be modified to increase the accuracy of the representation, when the difference between the response of the circuit to the stimulus signal and the final value is greater than a predetermined value.

According to the third aspect, the stimulus signal can be applied to the circuit for a predetermined duration of time. The stimulus signal can be applied to the circuit during a predetermined time period. The stimulus signal can comprise, for example, a voltage signal, a current signal, or any suitable stimulus signal. The system can include means for filtering the response of the circuit. For example, the filtering means can include means for low-pass filtering the response of the circuit. The circuit measurements can include one or more of a measurement of capacitance, a measurement of resistance, a measurement of capacitance and resistance, a measurement of DC voltage, a measurement of AC voltage, a measurement of DC voltage in a presence of AC voltage, a measurement of AC voltage in a presence of DC voltage, a measurement of DC current, a measurement of AC current, a measurement of DC current in a presence of AC current, and a measurement of AC current in a presence of DC current. According to an exemplary embodiment of the third aspect, the set of measurements can include at least two measurements of the response of the circuit.

According to a fourth aspect of the present invention, a circuit measurement acceleration device includes a circuit model. The circuit model comprises a representation of a circuit. The circuit is configured to receive a signal. A set of measurements is taken of the response of the circuit to the received signal. The steady state value of the response of the circuit is determined in accordance with the circuit model based on the set of measurements. A stimulus signal is generated based on the steady state value for driving the circuit model to the steady state value. The device includes a stimulus generator. The stimulus generator is configured to apply the stimulus signal to the circuit. The stimulus signal is configured to accelerate the response of the circuit to reach the steady state value.

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein:

FIG. 10 is a graph illustrating the response of the circuit, as measured from the tap point, versus time as a result of application of a stimulus signal twice, in accordance with an exemplary embodiment of the present invention.

DETAILED DESCRIPTION OF THE PREFERRED EMBODIMENTS

Exemplary embodiments of the present invention are directed to a system and method for accelerating circuit measurements. In particular, a procedure is provided to decrease the waiting time for taking circuit measurements by forcing an unknown circuit to quickly reach its steady state. According to exemplary embodiments, an active role can be played with the unknown circuit being measured, so as to hasten its approach to the final, settled measurement value. The acceleration scheme operates by taking, for example, two or more measurements after initial application of the measurement condition (e.g., a signal) to the unknown circuit. Since the circuit is unknown, to know its steady state or final value, a model of or approximation to the circuit can be used. In other words, a circuit model can be used to predict what the final condition of the unknown circuit will be, based on the preliminary readings of the response of the unknown circuit to the applied signal. The response of the unknown circuit can be observed for a limited amount of time, and then the circuit model can be used to calculate an estimated final value of the response of the unknown circuit. Once the estimate of the final value is calculated, the necessary stimulus to apply to the circuit model to drive the model substantially immediately to final condition can be computed based on the measured response of the unknown circuit and the estimated final value. The stimulus signal can be applied for a short duration of time to the circuit to force the circuit to reach its final value.

Since the circuit model may not be a perfect or exact representation of the actual unknown circuit, the computed stimulus can move the unknown circuit close to, but perhaps overshoot, the actual steady state condition. Thus, the unknown circuit may require some passive settling time. However, according to exemplary embodiments, the response of the circuit (this time, to the stimulus signal) can be observed again, so that a new estimate of the final value can be determined using the circuit model. The new estimate can be compared with the observed data. If the difference is larger than a suitable predetermined value, another correcting stimulus signal can be generated using the circuit model and applied to the circuit. Otherwise, the circuit has reached the final, steady state value. Such an approach can be performed recursively, until the circuit reaches its steady state. According to exemplary embodiments, the total time to reach a particular measurement stability objective can be dramatically reduced.

Figure 1:
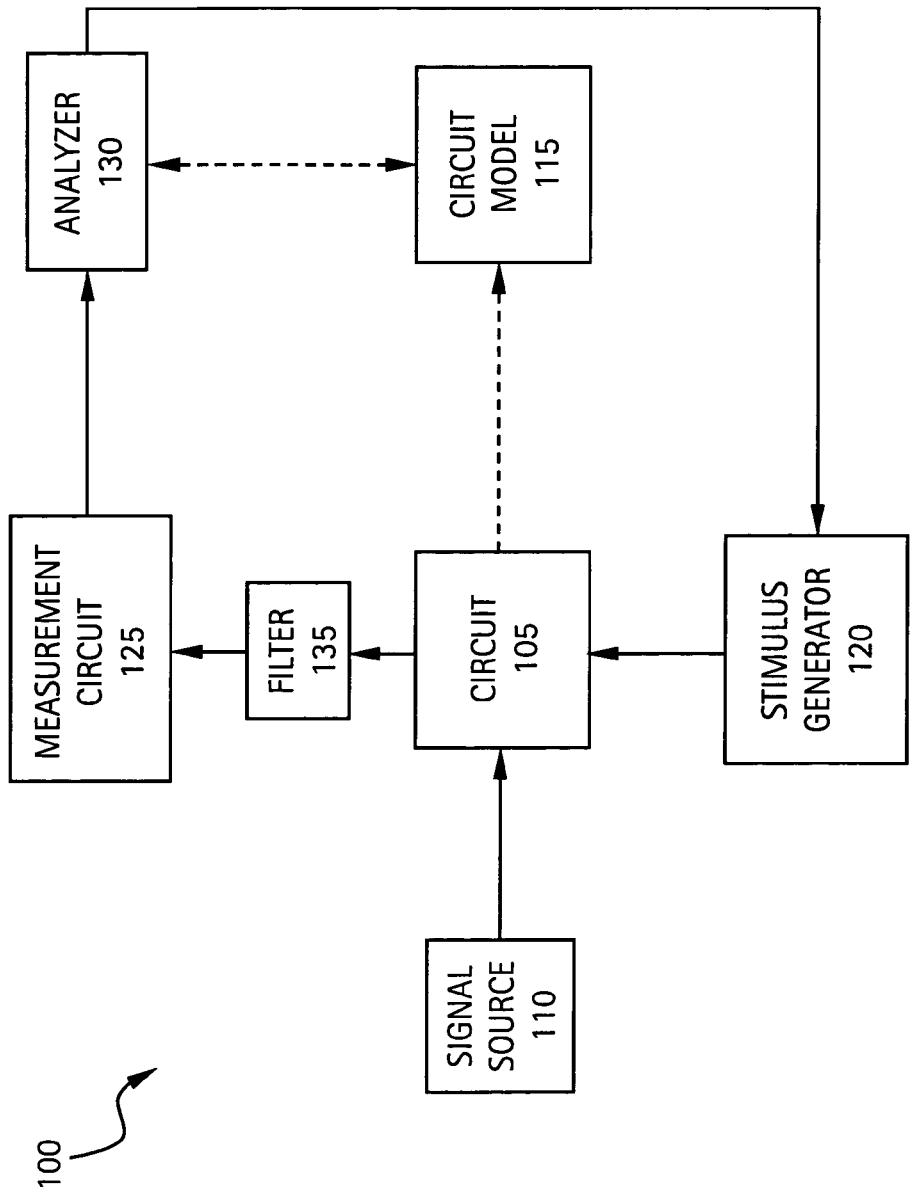
FIG. 1 is a diagram illustrating system for accelerating circuit measurements, in accordance with an exemplary embodiment of the present invention.

These and other aspects of the present invention will now be described in greater detail. FIG. 1 is a diagram illustrating system 100 for accelerating circuit measurements, in accordance with an exemplary embodiment of the present invention. The system 100 includes a circuit 105. The circuit 105 can comprise any suitable unknown circuit or system for which a corresponding circuit measurement is to be taken. An appropriate signal is applied to the circuit 105 by a signal source 110 that is in communication with the circuit 105. The signal source 110 is configured to generate the signal applied to the circuit 105. The signal source 110 can comprise any suitable circuit or device capable of generating a signal for application to the circuit 105, such as, for example, a signal to drive the circuit 105. Once the signal is applied to the circuit 105, a set of measurements (e.g., two or more measurements or any suitable number) can be taken of the response of the circuit 105 to the applied signal. The response of the circuit 105 to the applied signal can be observed for any suitable, but limited, amount of time.

The system 100 includes a circuit model 115. The circuit model 115 is a representation of the circuit 105. In other words, the circuit model 115 is an approximation to or estimation of the circuit 105. The circuit model 115 can be generated or otherwise created in any suitable manner. For example, the circuit 105 can be measured, probed, or otherwise analyzed using known circuit analysis techniques to determine the characteristics of the circuit 105, for example, to determine the possible components, responses, and other characteristics of the circuit 105. From such information, a model of or approximation to the circuit 105 can be constructed, for example, in software (e.g., using any suitable circuit modeling program), firmware, hardware, or any appropriate combination thereof. The resulting circuit model 115 is used to calculate the final or steady state value of the response of the circuit 105 to the applied signal by applying the observed measurements to the circuit model 115. In other words, a final or steady state value of the response of the circuit 105 is determined utilizing the circuit model 115 in accordance with the set of measurements of the observed response. Once the estimate of the final value is calculated, an appropriate stimulus signal can be generated for driving the circuit model 115 to the final value. Thus, a stimulus signal is generated in accordance with the final value for forcing or otherwise driving the circuit model 115 to the final value.

Figure 2:
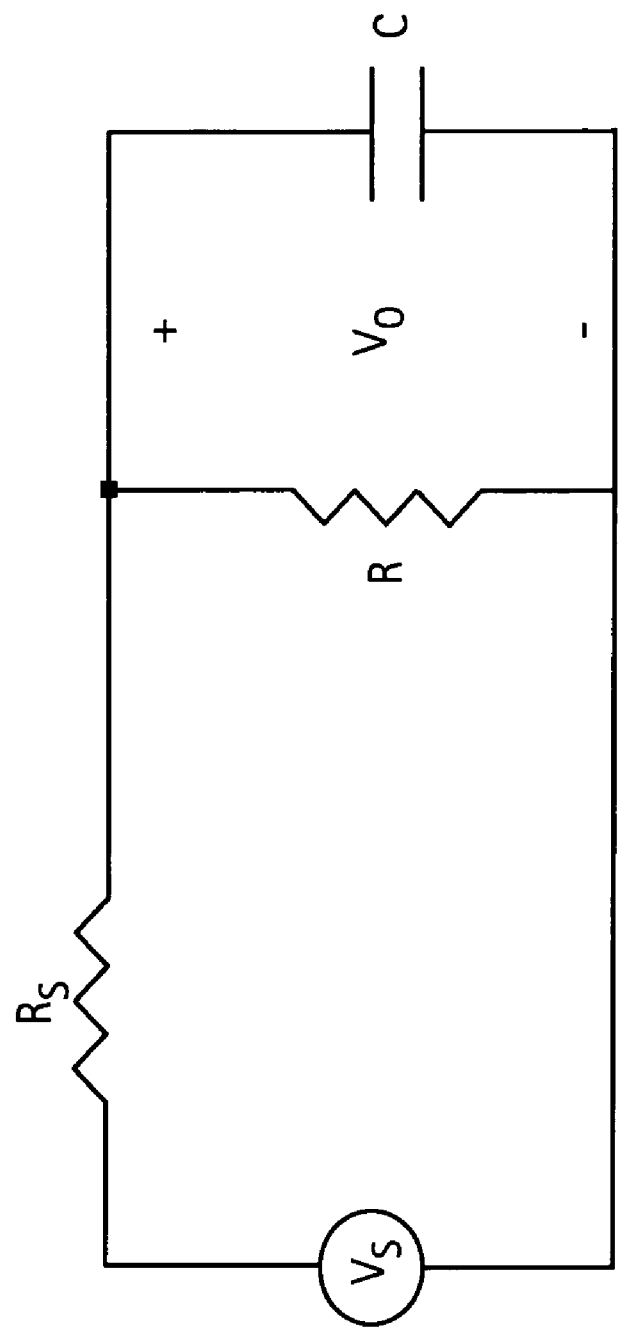
FIG. 2 is a diagram illustrating a circuit model as a parallel RC circuit with zero initial conditions, in accordance with an exemplary embodiment of the present invention.

For purposes of illustration and not limitation, FIG. 2 is a diagram illustrating a circuit model 215 as a parallel RC circuit with zero initial conditions, in accordance with an exemplary embodiment of the present invention. In other words, for purpose of the present illustration, after analysis and observation, it is assumed that the unknown circuit 105 can be modeled as the parallel RC circuit 215 illustrated in FIG. 2, with the values of $V_s$, $R_s$, R, $V_O$ and C depending on the characteristics of the circuit 105. The output voltage, $V_O$, of the circuit model 215 with initial conditions set to zero is of the form as expressed in Equation (1):

$$Vo = \frac{Vs}{Rs}R(1 - e^{-t/RC}) \quad (1)$$

where $$R = \frac{RsRl}{Rs + Rl}. \quad (2)$$

The output is thus of the form as expressed in Equation (3):

$$y = \alpha(1 - e^{-t/\tau}) \quad (3)$$

where $\alpha$ and $\tau$ are two unknowns. By taking, for example, two observations of the circuit 105 corresponding to the circuit model 215 at time $t_1$ and $t_2 = 2t_1$, $\alpha$ and $\tau$ can be solved. Accordingly, $$y_1 = \alpha(1 - e^{-t1/\tau}) \quad (4)$$

and $$y_2 = \alpha(1 - e^{-t2/\tau}). \quad (5)$$

Calculating a from Equation (4) and substituting into Equation (5) results in Equation (6), as follows:

$$y_2 = \frac{y_1}{1 - e^{-t_1/\tau}}(1 - e^{-t_2/\tau}). \quad (6)$$

Consequently, $$y_2 - y_1 = y_2 e^{-t_1/\tau} - y_1 e^{-t_2/\tau}. \quad (7)$$

Substituting $$x = e^{-t_1/\tau} \quad (8)$$

and taking $t_2 = 2t_1$ into consideration, Equation (7) can be written as follows:

$$y_1 x^2 - y_2 x + (y_2 - y_1) = 0. \quad (9)$$

One solution to Equation (9) is, for example, $x_1 = 1$. A second solution, $x_2$, can be used to calculate $\tau$ according to:

$$\tau = \frac{-t_1}{\ln(x_2)}. \quad (10)$$

Equation (10) can be used to calculate:

$$a = \frac{y_1}{1 - e^{-t_1/\tau}}. \quad (11)$$

Comparing Equations (1) and (3), it can be seen that a is the final or steady state value, $V_f$, of the circuit model 215, and is equal to $$a = \frac{V_s}{R_s} R = V_f. \quad (12)$$

Equation (12) can be used to calculate the value of R as:

$$R = \frac{a}{V_s} R_s = V_f \frac{R_s}{V_s}. \quad (13)$$

Once the unknowns have been calculated and the final value of the response of the circuit 105 (e.g., $V_f$) has been estimated, according to exemplary embodiments a stimulus signal can be generated and applied to the circuit 105 for a short duration of time to accelerate or otherwise force the response of the circuit 105 to reach the final value quickly. Continuing with the present illustration, Equation (1) can be used to calculate the voltage of the stimulus signal. Rearranging Equation (1), $$V_s = \frac{V_o R_s}{R(1 - e^{-t/\tau})} \quad (14)$$

where $\tau = RC$ and calculated in Equation (10). Assuming that the stimulus is applied for a duration of $\Delta t$, the required stimulus voltage to make the circuit 105 reach its final value, $V_f$, is calculated as follows:

$$V_{stimulus} = \frac{V_f R_s}{R(1 - e^{-\Delta t/\tau})}. \quad (15)$$

Alternatively, a current stimulus signal can be used to force the circuit 105 to reach its steady state. In such a case, the current source can produce $$\frac{V_{stimulus}}{R_s}$$

amount of current for a duration of $\Delta t$, which gives:

$$I_{stimulus} = \frac{V_f}{R(1 - e^{-\Delta t/\tau})}. \quad (16)$$

For purposes of illustration and not limitation, FIG. 2 can also be used to illustrate a circuit model 215 as a parallel RC circuit with non-zero initial conditions. The output voltage, $V_o$, of the circuit model 215 with an initial condition of $V_{initial}$ can be expressed as in Equation (17):

$$V_o = \frac{V_s R}{R_s} + \left(V_{initial} - \frac{V_s R}{R_s}\right) e^{-t/RC}. \quad (17)$$

Equation (17) is a special case of $$y = a + be^{-t/\tau} \quad (18)$$

with three unknowns:

$$a = \frac{V_s R}{R_s} \quad (19)$$

$$b = V_{initial} - a \quad (20)$$

$$\tau = RC. \quad (21)$$

The unknowns of Equations (19), (20) and (21) can be calculated using, for example, three observation points, as follows:

$$y_1 = a + be^{-t_1/\tau} \quad (22)$$

$$y_2 = a + be^{-t_2/\tau} \quad (23)$$

$$y_3 = a + be^{-t_3/\tau}. \quad (24)$$

From Equation (22), $$a = y_1 - be^{-t_1/\tau}. \quad (25)$$

Substituting Equation (25) into Equation (23) and rearranging terms, Equation (26) results as follows:

$$b = \frac{y_1 - y_2}{e^{-t_1/\tau} - e^{-t_2/\tau}}. \quad (26)$$

Substituting for b from Equation (26) into Equation (25), $$a = y_1 - \frac{y_1 - y_2}{e^{-t_1/\tau} - e^{-t_2/\tau}} e^{-t_1/\tau}. \qquad (27)$$

Rearranging Equation (24), $$\frac{y_3 - a}{b} = e^{-t_3/\tau}. \qquad (28)$$

Using Equation (26) and Equation (27), and substituting for b and a in Equation (28), $$\frac{y_3(e^{-t_1/\tau} - e^{-t_2/\tau}) - \left[\begin{array}{c} y_1(e^{-2t_1/\tau} - e^{-(t_1+t_2)/\tau}) - \\ y_1 e^{-t_1/\tau} + y_2 e^{-t_1/\tau} \end{array}\right]}{y_1 - y_2} = e^{-t_3/\tau}. \qquad (29)$$

Assume that the first sample was taken at, for example, $t_1=0$. Accordingly, Equation (29) becomes, $$y_3 - y_3 e^{-t_2/\tau} + y_1 e^{-t_2/\tau} - y_2 = e^{-t_3/\tau}(y_1 - y_2). \qquad (30)$$

Next, assuming that $$x = e^{-t_2/\tau} \qquad (31)$$

and that $t_3 = 2t_2$, Equation (30) can be written as follows:

$$(y_2 - y_1)x^2 + (y_1 - y_3)x + (y_3 - y_2) = 0. \qquad (32)$$

One solution to Equation (32) is, for example, $x_1=1$. A second solution, $x_2$, can be used to calculate $\tau$, where $\tau$ is $$\tau = \frac{-t_2}{\ln(x_2)}. \qquad (33)$$

Figure 3:
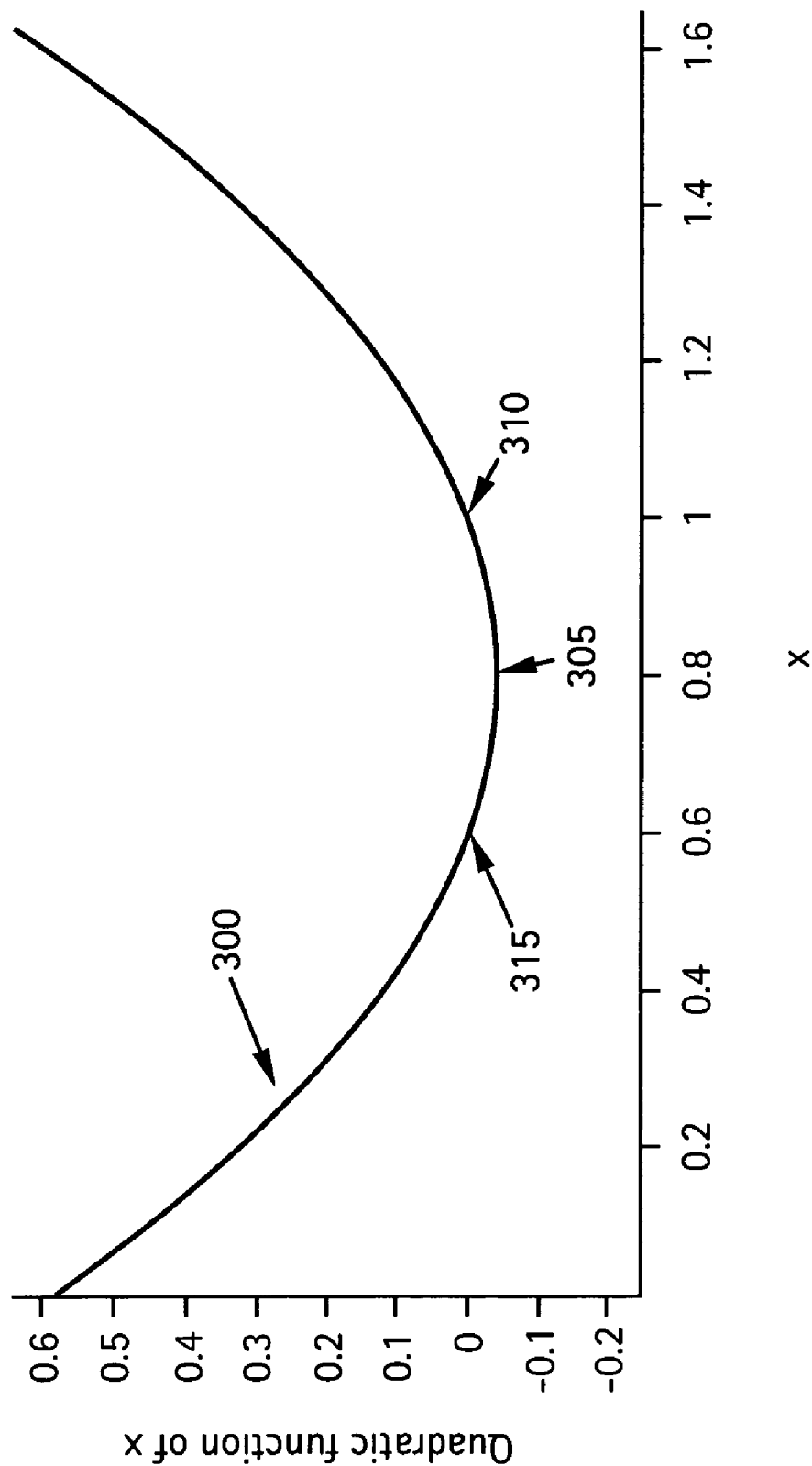
FIG. 3 is a graph illustrating a quadratic function of x versus x, in accordance with an exemplary embodiment of the present invention.

The time constant, $\tau$, should be positive. To be positive, $0 < x_2 < 1$. Assuming that the samples that are collected during the measurements are monotonic, the aforementioned condition for $x_2$ is fulfilled if $|(y_2-y_1)| > 0.5 > |(y_1-y_3)|$. Such a condition can be obtained by noting that if the first solution (e.g., $x_1$) is 1, then if samples are selected so that the maximum/minimum obtained by the quadratic equation is at a point where $x<1$, it can be assured that the second solution (e.g., $x_2$) will be less than 1. For example, FIG. 3 is a graph 300 illustrating the quadratic function of x versus x, in accordance with an exemplary embodiment of the present invention. As illustrated in FIG. 3, the minimum of the quadratic function of x occurs at point 305, which is approximately 0.8 (i.e., less than 1). Therefore, the first solution is $x_1=1.0$ (at point 310) and second solution is $x_2=0.6$ (at point 315), as desired.

Continuing with the present illustration, Equation (33) can be substituted into Equation (26) to calculate b, and then Equation (25) can be used to calculate a. The resistance R can be calculated using Equation (17). The initial condition $V_{initial}$ can be calculated using Equation (20). The capacitance C can be calculated using Equation (21). Additionally, Equation (17) can be rearranged to give:

$$V_S = \frac{(V_O - V_{initial}e^{-t/RC})R_S}{(1 - e^{-t/RC})R}. \qquad (34)$$

From Equation (18), it can be seen that the steady state or final value of the response of the circuit model 215 is $V_f = \alpha$. For example, to force or otherwise drive the circuit 105 to reach the steady state or final value, the following voltage stimulus signal can be applied for a duration of $\Delta t$ seconds:

$$V_{stimulus} = \frac{(V_f - V_{initial}e^{-\Delta t/RC})R_S}{(1 - e^{-\Delta t/RC})R}. \qquad (35)$$

Alternatively, a current stimulus signal can be used to force the circuit 105 to reach its steady state. In such a case, the current source can produce $$\frac{V_{stimulus}}{R_S}$$

amount of current for a duration of $\Delta t$, which gives:

$$I_{stimulus} = \frac{(V_f - V_{initial}e^{-\Delta t/RC})}{(1 - e^{-\Delta t/RC})R}. \qquad (36)$$

Consequently, the stimulus signal can comprise a voltage signal, a current signal, or any suitable stimulus signal, depending on such as, for example, the circuit 105 and the circuit model 115 on which the stimulus signal is based. Thus, the circuit model 115 can be used to estimate the final value of the response of the circuit 105, and the final value can then be used to determine a suitable stimulus signal for forcing or otherwise driving the circuit model 115 to the (estimated) final value quickly. As the circuit model 115 is a representation of or approximation to the circuit 105, the stimulus signal can then be used to accelerate the response of the circuit 105 to reach the final value. Since the circuit 105 has reached the final or steady state value in an accelerated manner, the time to produce accurate recorded values for purposes of circuit measurements can be greatly reduced. In other words, the total time to reach a particular measurement stability objective can be dramatically reduced.

Referring to FIG. 1, according to exemplary embodiments, the stimulus signal can be applied to the circuit 105. Accordingly, the system 100 includes a stimulus generator 120 in communication with the circuit 105. The stimulus generator 120 is configured to apply the stimulus signal to the circuit 105 for a suitably short or otherwise predetermined duration of time. The stimulus generator 120 can be any suitable circuit or device capable of providing the appropriate stimulus signal to the circuit 105. The length of time to apply the stimulus signal can depend on such factors as, for example, the circuit model 115 used, the type, nature, value and/or magnitude of stimulus signal calculated, and other like factors, and can be on the order of, for example, microseconds or milliseconds. Additionally or alternatively, the stimulus signal can be applied to the circuit 105 during a predetermined time period, such as, for example, after a suitable passive settling time for the circuit 105. As discussed previously, the stimulus signal is configured to accelerate, force or otherwise drive the circuit 105 to reach its final or steady state value quickly.

According to exemplary embodiments, the system 100 can include a measurement circuit 125 in communication with the circuit 105. The measurement circuit 125 can be configured to take the measurements of the response of the circuit 105 to, for example, the applied signal and the stimulus signals. To improve the measurements taken by the measurement circuit 125 of the response of the circuit 105, a suitable filter 135 can be used to filter noise and other interference from the response signal as measured by the measurement circuit 125. The filter 135 can be in communication with the circuit 105 and the measurement circuit 125. The filter 135 can be any suitable type of filter that is capable of filtering the response of the circuit 105, such as, for example, a low-pass filter or the like. The system 100 can also include an analyzer 130 in communication with the circuit 105 and the stimulus generator 125. The analyzer 130 can be configured to determine the final value of the response of the circuit 105 and to determine the stimulus signal(s) utilizing the circuit model 115. The stimulus generator 120 can then generate and apply to the circuit 105 the stimulus signal determined by the analyzer 130.

As discussed previously, the circuit model 115 is an approximation to the circuit 105. As a result, the circuit model 115 may not be an exact representation of the circuit 105. Since the circuit model 115 may not be a perfect or exact representation of the actual unknown circuit 105, the determined stimulus signal can move the unknown circuit 105 close to, but perhaps overshoot, the actual steady state condition. To address such a situation, the response of the circuit 105 to the stimulus signal can be observed, so that a new estimate of the final value can be determined using the circuit model 115. The new estimate can be compared with the observed data. If the difference is larger than a suitable predetermined value, another correcting stimulus signal can be generated using the circuit model 115 and applied to the circuit. Otherwise, the circuit 105 has reached the final, steady state value. Such an approach can be performed recursively, until the circuit 105 reaches its steady state.

In particular, a second set of measurements (e.g., two or more measurements or any suitable number) can be taken (e.g., by the measurement circuit 125) of the response of the circuit 105 to the stimulus signal to determine whether the circuit 105 has reached the final value. The difference between the response of the circuit 105 to the stimulus signal and the final value can be calculated to determine whether the circuit 105 has reached its final value or steady state. If the difference is less than a suitable predetermined value, then the circuit 105 has reached or has effectively reached the final value. The predetermined value can depend on such factors as, for example, the type of circuit 105 under test and its corresponding circuit model 115, the signals applied to the circuit 105, the estimated final value, and other like factors.

However, if the difference is greater than the predetermined value, then the circuit 105 has not yet reached the final value. Accordingly, a second final value of the response of the circuit 105 to the stimulus signal can be determined utilizing the circuit model 115 in accordance with the second set of measurements. A second stimulus signal can be determined based on the second final value (e.g., by the analyzer 130) for driving the circuit model 115 to the second final value. The second stimulus signal can be generated and applied (e.g., by the stimulus generator 120) to the circuit 105 to accelerate the response of the circuit 105 to reach the second final value. As noted previously, such an approach can be performed recursively, until the circuit 105 reaches its final value or steady state.

According to an alternative exemplary embodiment, the representation of the circuit 105 by the circuit model 115 can be modified to increase the accuracy of the representation when the difference between the response of the circuit 105 to the stimulus signal and the final value is greater than a predetermined value. The accuracy of the circuit model 115 can be increased by, for example, altering values of components and/or rearranging such components or the like to better approximate the circuit 105. For example, by recursively providing correcting stimulus signals to the circuit 105 and using more accurate representations of the circuit model 115 to generate such stimuli, the circuit 105 can be accelerated, forced or otherwise driven to reach its final or steady state value more quickly.

According to exemplary embodiments, the system 100 can be used to perform or used in conjunction with the performance of any number of suitable circuit measurements on the circuit 105. For example, the circuit measurements can include one or more of: the measurement of capacitance; the measurement of resistance; the measurement of capacitance and resistance; the measurement of DC voltage; the measurement of AC voltage; the measurement of DC voltage in the presence of AC voltage; the measurement of AC voltage in the presence of DC voltage; the measurement of DC current; the measurement of AC current; the measurement of DC current in the presence of AC current; the measurement of AC current in the presence of DC current; and/or other like circuit measurements. Such circuit measurements can depend on the type of circuit 105 being tested and the type(s) of circuit measurements desired. However, in each case, exemplary embodiments of the present invention can be used to accelerate the taking of such circuit measurements.

Figure 4:
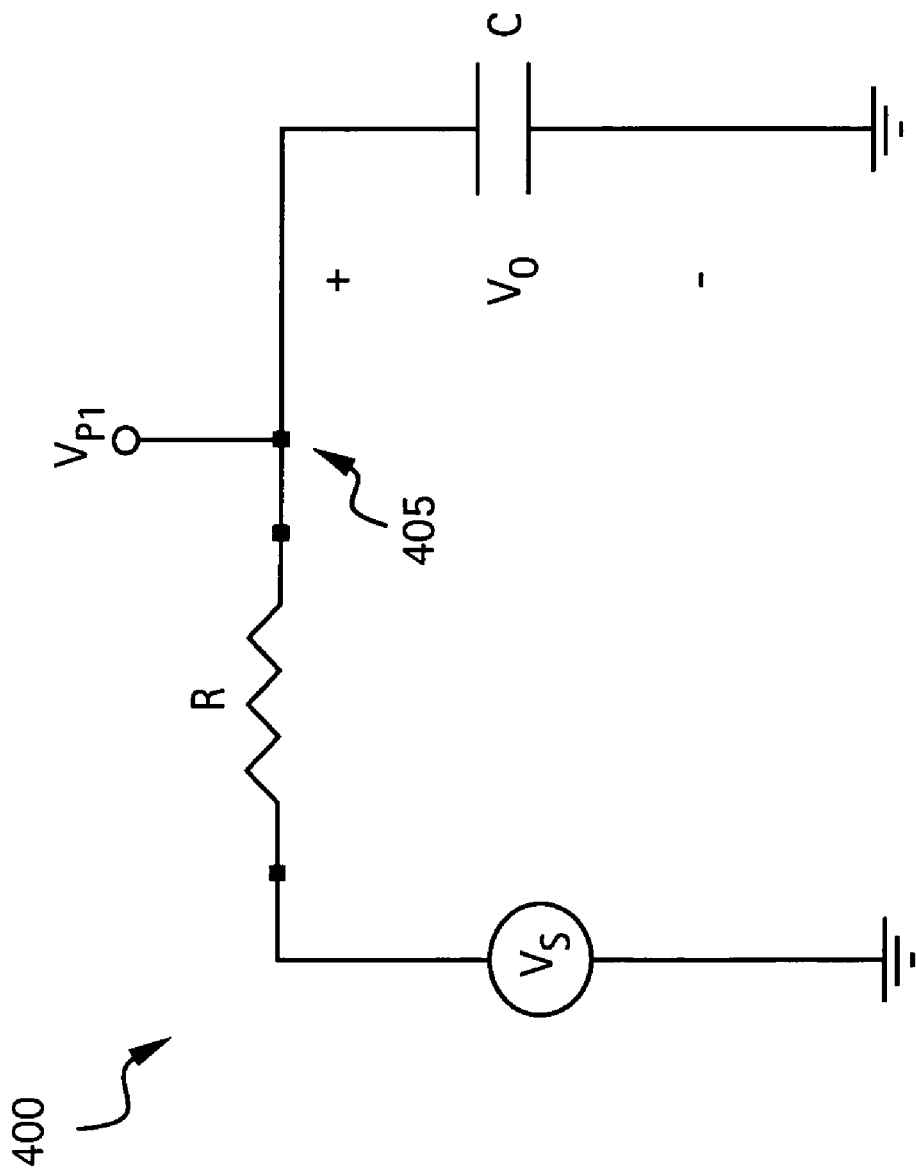
FIG. 4 is a diagram illustrating a circuit to be measured, in accordance with an exemplary embodiment of the present invention.
Figure 5:
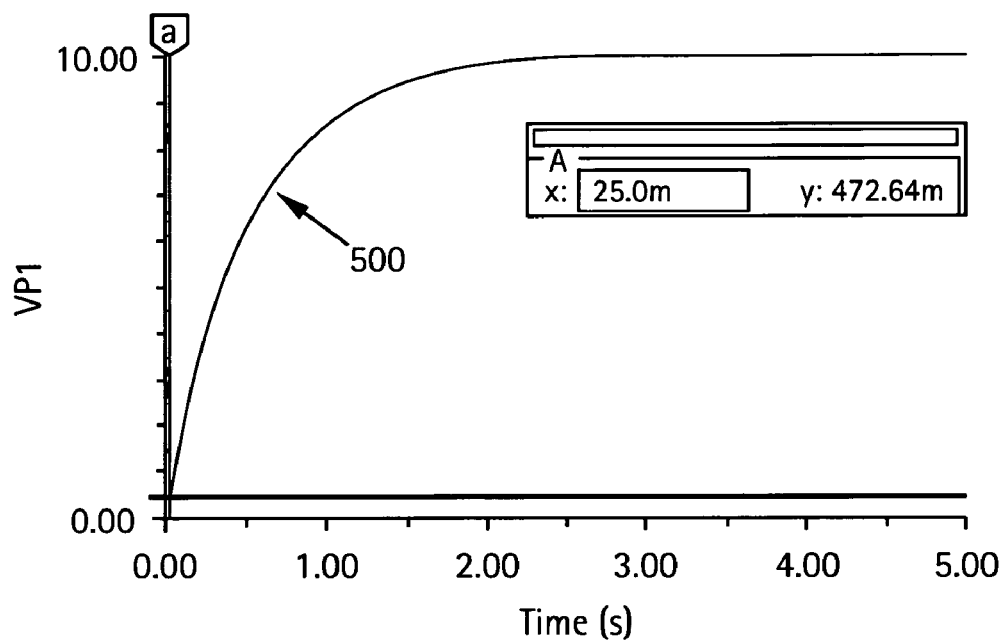
FIG. 5 is a graph illustrating the response of the circuit, as measured from a tap point, versus time, in accordance with an exemplary embodiment of the present invention.

FIG. 4 is a diagram illustrating a circuit 400 to be measured, in accordance with an exemplary embodiment of the present invention. The circuit 400 can comprise, for example, a purely capacitive transmission line or the like. In the example illustrated in FIG. 4, R=1 MΩ and C=500 nF, while the source voltage, $V_s$, equals 10 volts. A tap point 405 is placed on the circuit between R and C to measure the voltage level, $V_{P1}$, at the tap point 405 representing the output voltage, $V_O$, across the capacitor C. FIG. 5 is a graph 500 illustrating the response of the circuit 400, as measured from the tap point 405, versus time, in accordance with an exemplary embodiment of the present invention. As can be seen in FIG. 5, the circuit 400 reaches a steady state value of 10 V in approximately 2.5 seconds. Using the following Equation (37):

$$VP1 = V_f(1 - e^{-t/R1C}) \tag{37}$$

and by observing that the voltage level $V_{P1}$=472.64 mV at t=25 ms, the value of C is approximately 517 nF.

For purposes of illustration and not limitation, it can be shown that by applying an appropriate stimulus signal to the circuit 400, the circuit 400 can be made to settle within 225 milliseconds (ms) instead of 2.5 seconds. The computed capacitance can be used to calculate the stimulus signal needed to make the circuit 400 reach the steady state faster. Assuming the circuit model of the transmission line to be purely capacitive, then the circuit model can be represented as follows:

$$VP1(t) = V_f + (V_i - V_f)e^{-t/RC} \tag{38}$$

where $V_i$ is an initial condition. For example, if it is desired to make $V_{P1}$ reach 10 V at, for example, 200 ms later (e.g., at 25 ms+200 ms=225 ms), then using Equation (38) and substituting the values results in $$10 = V_f + (472.64 * 10^{-3} - V_f) e^{-200 * 10^{-3}/(10^6 * 500 * 10^{-9})}. \quad (39)$$

Solving Equation (39), the estimated final value is $V_f = 30$ V. Thus, a stimulus signal of $V_{stimulus} = V_f - V_s = 30\,V - 10\,V = 20\,V$ can be applied in addition to the source voltage ($V_S = 10$ V) to accelerate the response of the circuit 400 to reach the steady state.

Figure 6:
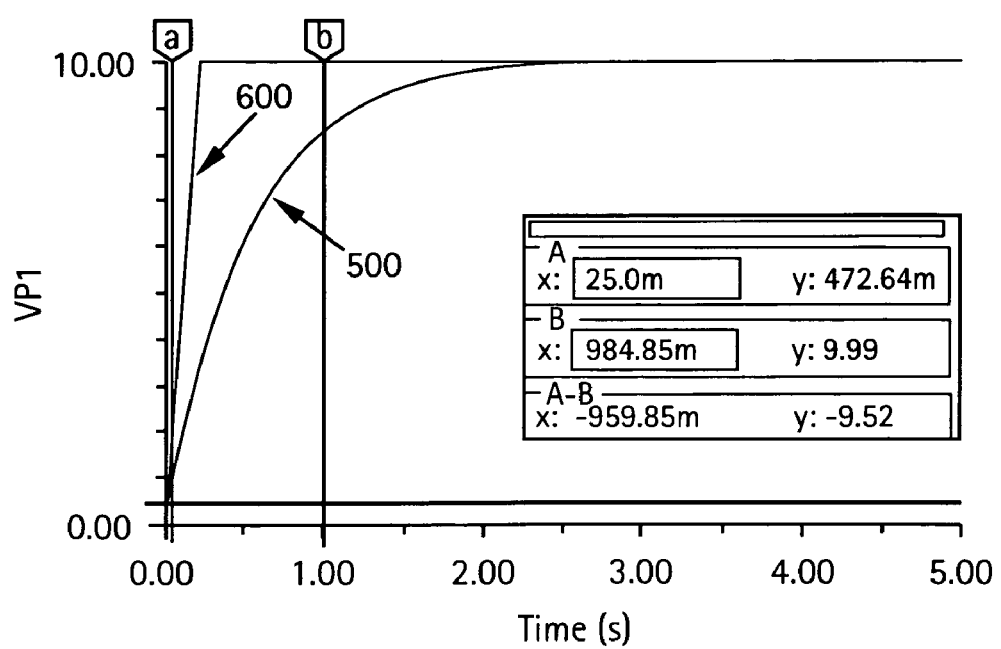
FIG. 6 is a graph illustrating the response of the circuit, as measured from the tap point, versus time as a result of application of a stimulus signal, in accordance with an exemplary embodiment of the present invention.

FIG. 6 is a graph 600 illustrating the response of the circuit 400, as measured from the tap point 405, versus time as a result of application of a stimulus signal, in accordance with an exemplary embodiment of the present invention. As illustrated in FIG. 6, by applying the stimulus signal of $V_{stimulus} = 20$ V in addition to the source voltage ($V_S = 10$ V) from 25 ms to 225 ms, the output voltage $V_O$ across the capacitor C can reach the steady state value of 10 V at 225 ms. By applying the stimulus signal according to exemplary embodiments, the measurement of the circuit 400 can be performed within 200 ms. Without such a stimulus signal, the measurement could take as long as 3.5 seconds.

Figure 7:
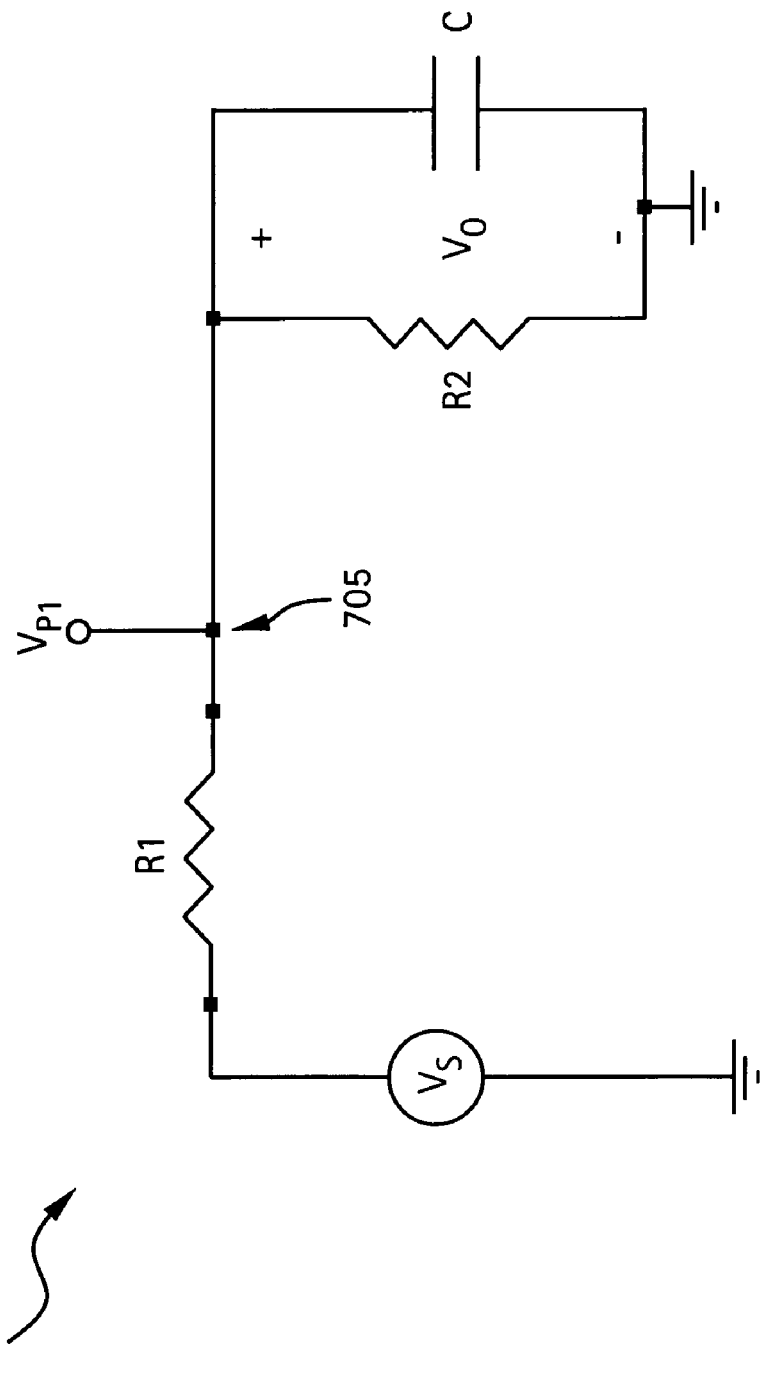
FIG. 7 is a diagram illustrating a circuit to be measured, in accordance with an exemplary embodiment of the present invention.
Figure 8:
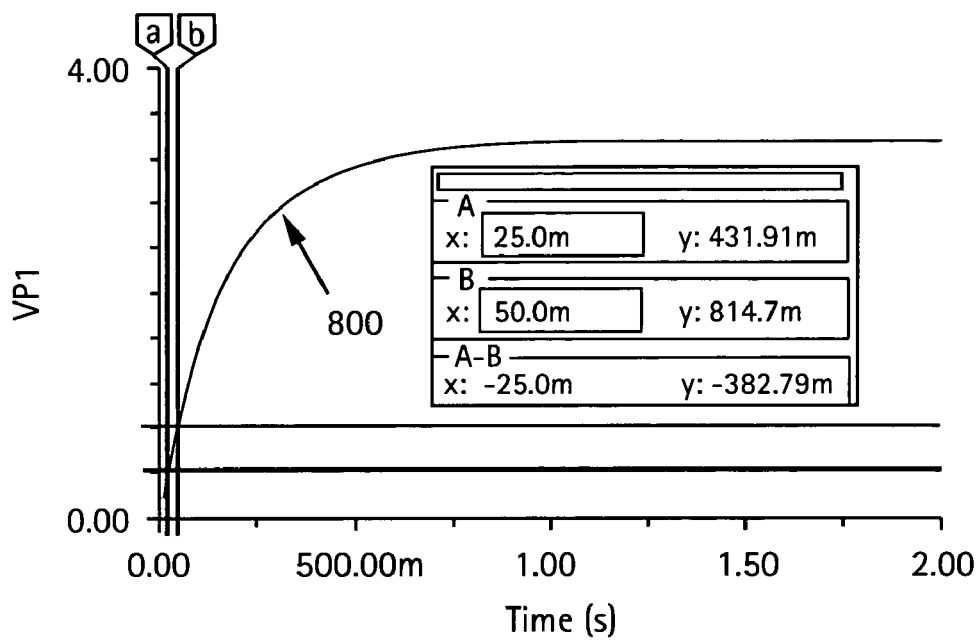
FIG. 8 is a graph illustrating the response of the circuit, as measured from the tap point, versus time, in accordance with an exemplary embodiment of the present invention.

For purposes of illustration and not limitation, FIG. 7 is a diagram illustrating a circuit 700 to be measured, in accordance with an exemplary embodiment of the present invention. The circuit 700 can comprise, for example, a parallel RC circuit on a transmission line or the like. In the example illustrated in FIG. 7, R1=1 MΩ, R2=500 KΩ and C=500 nF, while $V_s = 10$ V. A tap point 705 is placed on the circuit between R1 and the parallel combination of R2 and C to measure the voltage level, $V_{P1}$, at the tap point 705 representing the output voltage $V_O$ across the parallel RC circuit. FIG. 8 is a graph 800 illustrating the response of the circuit 700, as measured from the tap point 705, versus time, in accordance with an exemplary embodiment of the present invention. From graph 800, the steady state response of the circuit 700 is 3.34 V.

Taking measurements of the circuit 700 results in the values of $y_1 = 431.91$ mV at $t_1 = 25$ ms, and $y_2 = 814.7$ mV at $t_2 = 50$ ms (as illustrated in FIG. 8). Using these values in Equation (9), $x_2 = 0.2071$. Using Equations (10) and (11), $a = V_f = 3.8$ V and $\tau = 0.2071$. R2 can be found by using Equations (13) and (2). Thus, R2=612 KΩ. C can be found using Equation (14), such that C=545 nF. However, although the error in the calculated capacitance is approximately 9%, the error in the calculated resistance is approximately 22%.

Figure 9:
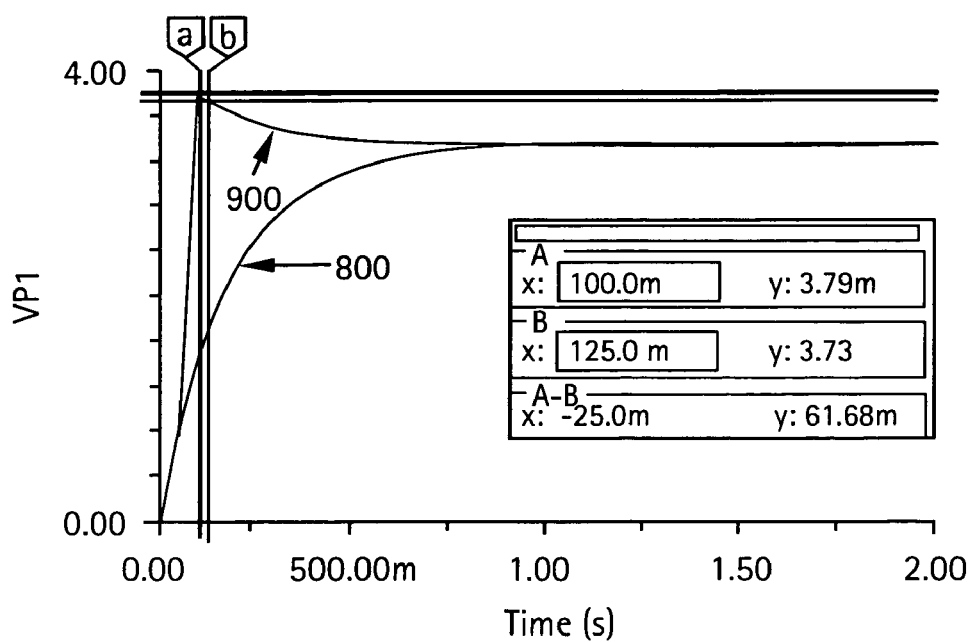
FIG. 9 is a graph illustrating the response of the circuit, as measured from the tap point, versus time as a result of application of a stimulus signal once, in accordance with an exemplary embodiment of the present invention.

According to exemplary embodiments, the resistance error can be improved by applying a stimulus voltage of 38.7696 V from 50 ms to 100 ms, as shown in FIG. 9. FIG. 9 is a graph 900 illustrating the response of the circuit 700, as measured from the tap point 705, versus time as a result of application of a stimulus signal once, in accordance with an exemplary embodiment of the present invention. FIG. 10 is a graph 1000 illustrating the response of the circuit 700, as measured from the tap point 705, versus time as a result of application of a stimulus signal twice, in accordance with an exemplary embodiment of the present invention. The value of the stimulus signal is obtained from the circuit model of a parallel RC circuit using the following Equation (40):

$$V_{stimulus} = \frac{(V_f - V_{initial} e^{-\Delta t/RC}) R_s}{(1 - e^{-\Delta t/RC}) R} \quad (40)$$

Using the response of the circuit 700 illustrated in FIGS. 9 and 10, Table 1 can be generated comparing the resulting output voltage $V_O$ (as measured from tap point 705) from application of the stimulus signal once and twice.

TABLE 1

Comparison between using stimulus signal once and twice.

| time in ms | Voltage in volts (FIG. 9), Stimulus applied once | Voltage in volts (FIG. 10), Stimulus applied twice |
|---|---|---|
| 100 | 3.79 | |
| 125 | 3.73 | |
| 150 | 3.68 | |
| 175 | 3.63 | |
| 200 | 3.6 | 3.46 |
| 250 | 3.53 | 3.43 |
| 300 | 3.48 | 3.4 |
| 350 | 3.44 | 3.39 |
| 400 | 3.42 | 3.37 |
| 450 | 3.39 | 3.36 |
| 500 | 3.38 | 3.36 |
| 550 | 3.37 | 3.35 |

With initial conditions, the equation for the output of the circuit model corresponding to circuit 700 is of the form:

$$y = a + b e^{-t/\tau}. \quad (41)$$

With Equation (41), the following Equation (42) can be solved by taking samples at $t_1 = 0$ and $t_3 = 2t_2$:

$$(y_2 - y_1) x^2 + (y_1 - y_3) x + (y_3 - y_2) = 0 \quad (42)$$

Points should be selected such that $|y_2 - y_1| > 0.5 > |y_3 - y_1|$, as discussed previously. As noted above, such a condition is required for the "calculated time constant"

$$\tau = \frac{-(t_2 - t_1)}{\ln(x_2)}$$

to be positive. Thus, points can be selected at 100 ms, 125 ms, and 150 ms in FIG. 9. Using these points, R2 is approximately 522 KΩ, which is closer to the actual value of 500 KΩ than what had been calculated previously. It is noted that the analysis was performed within 200 ms, rather than waiting for the circuit 700 to settle in 1 second and then doing the calculations. At 200 ms, the output voltage without the stimulus signal would have been 2.25 V. Thus, by applying the stimulus signal, the result is closer at t=200 ms to the steady state of 3.34 V, compared to the situation where no such stimulus signal is applied.

By performing another iteration of stimulus application, the results can be improved further. Using Equation (40) with the initial point set at 150 ms, a second stimulus signal of 6.3562 V for 25 ms can be used. A voltage of 6.3562−10=−3.64 V can be applied to achieve the desired stimulus. As is illustrated in Table 1, the response of the circuit 705 is closer to steady state (3.34 V) at 200 ms after application of the second stimulus signal, compared to the value given in Table 1 for a single application of the stimulus signal at 200 ms. After application of the second stimulus signal, the circuit response can either be allowed to substantially completely settle, or the response at, for example, t=350 ms can be considered settled and the corresponding result taken as the final value. Using the response from FIG. 9 at t=350 ms as the final result, R2 is approximately 524 KΩ. However, using the response from FIG. 10 at t=350 ms as the final result, R2 is approximately 513 KΩ. Thus, the resistance error is approximately 2.5% using two applications of the stimulus signal as illustrated in FIG. 10, compared with a resistance error of approximately 4.8% using a single application of the stimulus signal as illustrated in FIG. 9. However, any suitable number of applications of stimulus signals can be applied to the circuit to accelerate the response of the circuit to its final value or steady state. The nature, type and number of applications of the stimulus signal will depend on the complexity of the circuit under test and the corresponding circuit model, the type of circuit measurement to be taken, and other like factors. In addition, it is noted that instead of using a voltage source as the stimulus signal, a current source can be used to provide the stimulus.

Each of modules of the system 100, including the circuit 105, the signal source 110, the stimulus generator 120, the measurement circuit 125, the analyzer 130, and the filter 135, or any combination thereof, can be comprised of any suitable type of electrical or electronic circuit, component or device that is capable of performing the functions associated with the respective element. According to such an exemplary embodiment, each circuit, component or device can be in communication with another circuit, component or device using any appropriate type of electrical connection that is capable of carrying electrical information. Alternatively, each of the modules of the system 100 can be comprised of any combination of hardware, firmware and software that is capable of performing the function associated with the respective module. According to an exemplary embodiment, the circuit model 115, the stimulus generator 120, the measurement circuit 125, the analyzer 130, and the filter 135 can comprise, for example, a circuit testing device or equipment that can be connected or otherwise coupled to the circuit 105 to test or otherwise perform circuit measurements on the circuit 105.

Alternatively, the system 100, including the circuit model 115, the stimulus generator 120, the measurement circuit 125, the analyzer 130, and the filter 135, can be comprised of a microprocessor and associated memory that stores the steps of a computer program to perform the functions of the modules of the system 100. The microprocessor can be any suitable type of processor, such as, for example, any type of general purpose microprocessor or microcontroller, a digital signal processing (DSP) processor, an application-specific integrated circuit (ASIC), a programmable read-only memory (PROM), an erasable programmable read-only memory (EPROM), an electrically-erasable programmable read-only memory (EEPROM), a computer-readable medium, or the like. The memory can be any suitable type of computer memory or any other type of electronic storage medium, such as, for example, read-only memory (ROM), random access memory (RAM), cache memory, compact disc read-only memory (CDROM), electro-optical memory, magneto-optical memory, or the like. As will be appreciated based on the foregoing description, the memory can be programmed using conventional techniques known to those having ordinary skill in the art of computer programming. For example, the actual source code or object code of the computer program can be stored in the memory. In addition, according to an exemplary embodiment, various circuit models 115 can be stored in the memory and retrieved (e.g., by the analyzer 130) based on the particular circuit 105 under test.

Figure 11A:
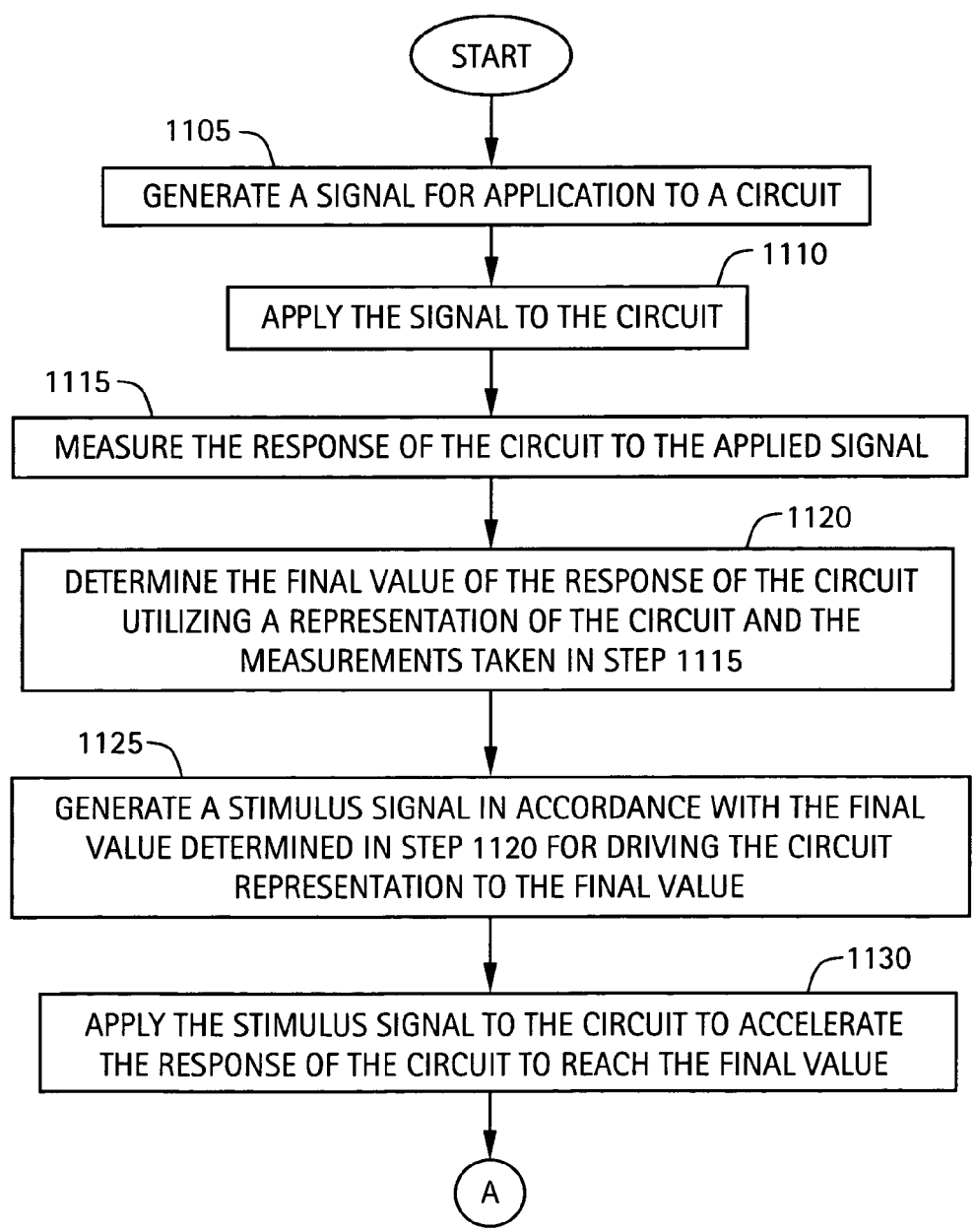
FIGS. 11A and 11B are flowcharts illustrating steps for accelerating circuit measurements, in accordance with an exemplary embodiment of the present invention.
Figure 11B:
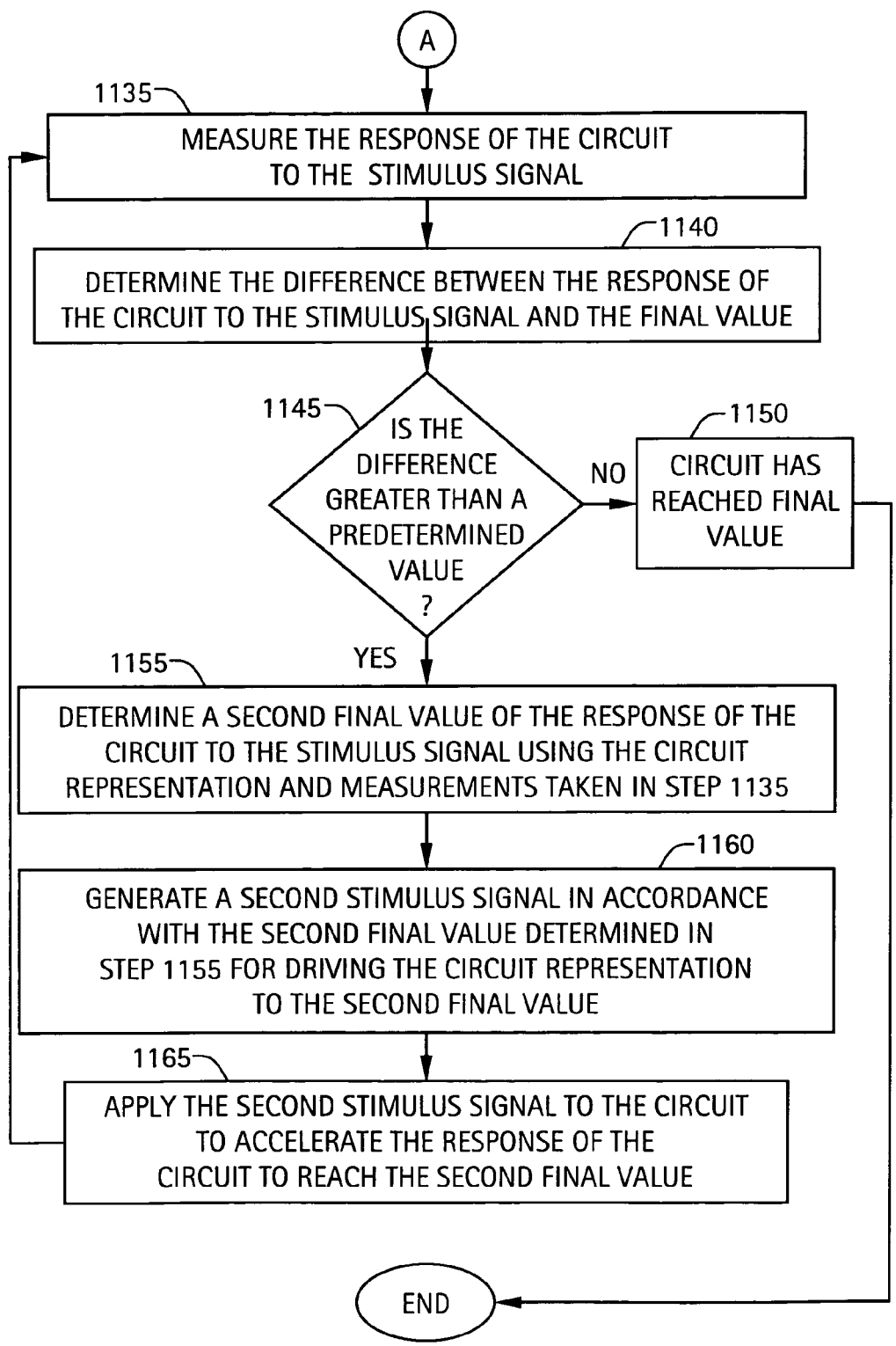

FIGS. 11A and 11B are flowcharts illustrating steps for accelerating circuit measurements, in accordance with an exemplary embodiment of the present invention. As illustrated in FIG. 11A, in step 1105, a signal is generated for application to a circuit. In step 1110, the signal is applied to the circuit. In step 1115, the response of the circuit to the applied signal is measured. According to an exemplary embodiment, the quality of the measurements can be improved by filtering the response of the circuit, such as, for example, by low-pass filtering the response of the circuit. In step 1120, the final value of the response of the circuit is determined utilizing a representation of the circuit and the measurements taken in step 1115. In step 1125, a stimulus signal is generated in accordance with the final value determined in step 1120 for driving the circuit representation to the final value. The stimulus signal can comprise, for example, a voltage signal, a current signal, or other suitable stimulus signal that is capable of driving the circuit representation to the final value. In step 1130, the stimulus signal is applied to the circuit. The stimulus signal is configured to accelerate the response of the circuit to reach the final value or steady state. The stimulus signal can be applied to the circuit for a predetermined duration of time and/or during a predetermined time period.

As illustrated in FIG. 11B, in step 1135, the response of the circuit to the stimulus signal can be measured. It can then be determined whether the circuit has reached the final value. For example, in step 1140, the difference between the response of the circuit to the stimulus signal and the final value can be determined. In step 1145, if the difference is less than a suitable predetermined value, then the circuit has reached the final value (in step 1150). Accordingly, the circuit has reached a suitable steady state for purposes of circuit measurement or the like. However, in step 1145, if the difference is greater than the predetermined value, then the circuit has not yet reached the final value. Consequently, in step 1155, a second final value of the response of the circuit to the stimulus signal can be determined using the circuit representation and the measurements taken in step 1135. In step 1160, a second stimulus signal can be generated in accordance with the second final value determined in step 1155 for driving the circuit representation to the second final value. In step 1165, the second stimulus signal can be applied to the circuit to accelerate the response of the circuit to reach the second final value. The procedure can then return to step 1135 to measure the response of the circuit to the (second) stimulus signal, with a subsequent determination made of whether the circuit has reached the final value. As discussed previously, such an approach can be performed recursively, until the circuit reaches its final value or steady state.

One or more of the steps for accelerating circuit measurements as illustrated in FIGS. 11A and 11B can be performed by a computer program embodied in any computer-readable medium for use by or in connection with an instruction execution system, apparatus, or device, such as a computer-based system, processor-containing system, or other system that can fetch the instructions from the instruction execution system, apparatus, or device and execute the instructions. As used herein, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium can include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CDROM).

It will be appreciated by those of ordinary skill in the art that the present invention can be embodied in various specific forms without departing from the spirit or essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

All United States patents and applications, foreign patents, and publications discussed above are hereby incorporated herein by reference in their entireties.

What is claimed is:

1. A system for accelerating circuit measurements, comprising:
   a circuit,
   wherein a signal is applied to the circuit, and
   wherein a set of measurements is taken of a response of the circuit to the applied signal;
   a circuit model,
   wherein the circuit model comprises a representation of the circuit,
   wherein a final value of the response of the circuit is determined utilizing the circuit model in accordance with the set of measurements, and
   wherein a stimulus signal is generated in accordance with the final value for driving the circuit model to the final value; and
   a stimulus generator in communication with the circuit,
   wherein the stimulus generator is configured to apply the stimulus signal to the circuit,
   wherein the stimulus signal is configured to accelerate the response of the circuit to reach the final value,
   wherein a second set of measurements is taken of a response of the circuit to the stimulus signal to determine whether the circuit has reached the final value, and
   wherein a second final value of the response of the circuit to the stimulus signal is determined utilizing the circuit model in accordance with the second set of measurements, when a difference between the response of the circuit to the stimulus signal and the final value is greater than a predetermined value.

2. The system of claim 1, comprising:
   a signal source in communication with the circuit,
   wherein the signal source is configured to generate the signal applied to the circuit.

3. The system of claim 1, comprising:
   a measurement circuit in communication with the circuit,
   wherein the measurement circuit is configured to take measurements of the response of the circuit.

4. The system of claim 1, comprising:
   an analyzer in communication with the circuit and the stimulus generator,
   wherein the analyzer is configured to determine the final value of the response of the circuit and to determine the stimulus signal utilizing the circuit model.

5. The system of claim 1, wherein a second stimulus signal is generated in accordance with the second final value for driving the circuit model to the second final value, and
   wherein the second stimulus signal is applied to the circuit to accelerate the response of the circuit to reach the second final value.

6. The system of claim 1, wherein the stimulus signal is applied to the circuit for a predetermined duration of time.

7. The system of claim 1, wherein the stimulus signal is applied to the circuit during a predetermined time period.

8. The system of claim 1, wherein the stimulus signal comprises a voltage signal.

9. The system of claim 1, wherein the stimulus signal comprises a current signal.

10. The system of claim 1, further comprising:
    a filter in communication with the circuit,
    wherein the filter is configured to filter the response of the circuit.

11. The system of claim 10, wherein the filter comprises a low-pass filter.

12. The system of claim 1, wherein the circuit measurements comprise at least one of a measurement of capacitance, a measurement of resistance, a measurement of capacitance and resistance, a measurement of DC voltage, a measurement of AC voltage, a measurement of DC voltage in a presence of AC voltage, a measurement of AC voltage in a presence of DC voltage, a measurement of DC current, a measurement of AC current, a measurement of DC current in a presence of AC current, and a measurement of AC current in a presence of DC current.

13. The system of claim 1, wherein the set of measurements comprises at least two measurements of the response of the circuit.

14. A system for accelerating circuit measurements, comprising:
    a circuit
    wherein a signal is applied to the circuit, and
    wherein a set of measurements is taken of a response of the circuit to the applied signal;
    a circuit model,
    wherein the circuit model comprises a representation of the circuit,
    wherein a final value of the response of the circuit is determined utilizing the circuit model in accordance with the set of measurements, and
    wherein a stimulus signal is generated in accordance with the final value for driving the circuit model to the final value; and
    a stimulus generator in communication with the circuit,
    wherein the stimulus generator is configured to apply the stimulus signal to the circuit, and
    wherein the stimulus signal is configured to accelerate the response of the circuit to reach the final value,
    wherein a second set of measurements is taken of a response of the circuit to the stimulus signal to determine whether the circuit has reached the final value, and
    wherein the representation of the circuit by the circuit model is modified to increase an accuracy of the representation, when a difference between the response of the circuit to the stimulus signal and the final value is greater than a predetermined value.

15. A method of accelerating circuit measurements, comprising the steps of:
    a) applying a signal to a circuit;
    b) measuring a response of the circuit to the applied signal;
    c) determining a final value of the response of the circuit utilizing a representation of the circuit and measurements taken in step (b);
    d) generating a stimulus signal in accordance with the final value determined in step (c) for driving the circuit representation to the final value;
    e) applying the stimulus signal to the circuit,
    wherein the stimulus signal is configured to accelerate the response of the circuit to reach the final value;
    f) measuring a response of the circuit to the stimulus signal;
    g) determining whether the circuit has reached the final value;

h) determining a difference between the response of the circuit to the stimulus signal and the final value; and i) determining a second final value of the response of the circuit to the stimulus signal using the circuit representation and measurements taken in step (f), when the difference determined in step (h) is greater than a predetermined value.

16. The method of claim 15, comprising the steps of:

j) generating a second stimulus signal in accordance with the second final value determined in step (i) for driving the circuit representation to the second final value; and k) applying the second stimulus signal to the circuit to accelerate the response of the circuit to reach the second final value.

17. The method of claim 15, wherein step (e) comprises the step of:

applying the stimulus signal to the circuit for a predetermined duration of time.

18. The method of claim 15, wherein step (e) comprises the step of:

applying the stimulus signal to the circuit during a predetermined time period.

19. The method of claim 15, wherein the stimulus signal comprises a voltage signal.

20. The method of claim 15, wherein the stimulus signal comprises a current signal.

21. The method of claim 15, further comprising the step of: filtering the response of the circuit.

22. The method of claim 21, wherein the filtering step comprises the step of:

low-pass filtering the response of the circuit.

23. The method of claim 15, wherein the circuit measurements comprise at least one of a measurement of capacitance, a measurement of resistance, a measurement of capacitance and resistance, a measurement of DC voltage, a measurement of AC voltage, a measurement of DC voltage in a presence of AC voltage, a measurement of AC voltage in a presence of DC voltage, a measurement of DC current, a measurement of AC current, a measurement of DC current in a presence of AC current, and a measurement of AC current in a presence of DC current.

24. A method of accelerating circuit measurements, comprising the steps of:

a) applying a signal to a circuit;

b) measuring a response of the circuit to the applied signal;

c) determining a final value of the response of the circuit utilizing a representation of the circuit and measurements taken in step (b);

d) generating a stimulus signal in accordance with the final value determined in step (c) for driving the circuit representation to the final value;

e) applying the stimulus signal to the circuit, wherein the stimulus signal is configured to accelerate the response of the circuit to reach the final value;

f) measuring a response of the circuit to the stimulus signal;

g) determining whether the circuit has reached the final value;

h) determining a difference between the response of the circuit to the stimulus signal and the final value; and i) modifying the circuit representation to increase an accuracy of the representation, when the difference determined in step (h) is greater than a predetermined value.

* * * * *